(12) United States Patent
Eckelmann-Wendt et al.

(10) Patent No.: US 11,334,451 B2
(45) Date of Patent: May 17, 2022

(54) METHOD AND APPARATUS FOR REDUNDANT DATA PROCESSING IN WHICH THERE IS NO CHECKING FOR DETERMINING WHETHER RESPECTIVE TRANSFORMATIONS ARE LINKED TO A CORRECT PROCESSOR CORE

(71) Applicant: SIEMENS MOBILITY GMBH, Munich (DE)

(72) Inventors: Uwe Eckelmann-Wendt, Wolfenbuettel (DE); Stefan Gerken, Braunschweig (DE)

(73) Assignee: Siemens Mobility GmbH, Munich (DE)

( * ) Notice: Subject to any disclaimer, the term of this patent is extended or adjusted under 35 U.S.C. 154(b) by 68 days.

(21) Appl. No.: 16/324,587

(22) PCT Filed: Jul. 24, 2017

(86) PCT No.: PCT/EP2017/068635
§ 371 (c)(1),
(2) Date: Feb. 11, 2019

(87) PCT Pub. No.: WO2018/033344
PCT Pub. Date: Feb. 22, 2018

(65) Prior Publication Data
US 2019/0188093 A1  Jun. 20, 2019

(30) Foreign Application Priority Data
Aug. 17, 2016 (DE) .................... 10 2016 215 345.5

(51) Int. Cl.
*G06F 11/16* (2006.01)
*G06F 30/34* (2020.01)
*G06F 11/28* (2006.01)

(52) U.S. Cl.
CPC .......... *G06F 11/1641* (2013.01); *G06F 11/28* (2013.01); *G06F 30/34* (2020.01); *G06F 2201/83* (2013.01); *G06F 2201/845* (2013.01)

(58) Field of Classification Search
CPC ............. G06F 11/1629; G06F 11/1654; G06F 11/1633; G06F 11/1641; G06F 11/1645;
(Continued)

(56) References Cited

U.S. PATENT DOCUMENTS 5,911,059 A * 6/1999 Profit, Jr. .............. G06F 11/261
703/20
7,353,401 B2  4/2008 Liang
(Continued)

FOREIGN PATENT DOCUMENTS

CN  102591763 A  7/2012
CN  103635884 A  3/2014
(Continued)

OTHER PUBLICATIONS

Andrea Höller et al, "Patterns for Automated Software Diversity to Support Security and Reliability", Pattern Languages of Programs, ACM, 2 Penn Plaza, Suite 701 New York NY 10121-0701 USA, (Jul. 8, 2015), DOI:10.1145/2855321.2855360, ISBN 978-1-4503-3847-9, pp. 1-13, XP058079545.

*Primary Examiner* — Joseph O Schell
(74) *Attorney, Agent, or Firm* — Laurence A. Greenberg; Werner H. Stemer; Ralph E. Locher

(57) ABSTRACT

An arrangement for redundant data processing has an integrated circuit in which the functionality of a multi-core processor is implemented. Processor cores (40; 50) of the multi-core processor are each designed to execute a useful program. The results which emerge from the execution of the useful program by the different processor cores are compared by a comparison module of the arrangement. The processor cores differ from one another with respect to an
(Continued)

address or data structure (AS1, AS2; DS1, DS2) which is used by a processor core to respectively store and read data in or from a memory area (70; 80) that is assigned to the particular processor core. In terms of hardware, the individual processor cores are at least partially implemented separately in the integrated circuit.

15 Claims, 1 Drawing Sheet

(58) Field of Classification Search
CPC ........ G06F 11/165; G06F 11/18; G06F 11/28; G06F 2201/845
See application file for complete search history.

(56) References Cited

U.S. PATENT DOCUMENTS

| | | | |
|---|---|---|---|
| 7,398,387 B2 | 7/2008 | Liang | |
| 7,877,627 B1 | 1/2011 | Freydel | |
| 8,443,230 B1 | 5/2013 | James-Roxby et al. | |
| 8,479,042 B1* | 7/2013 | James-Roxby | G06F 11/1683 |
| | | | 714/12 |
| 8,527,681 B2 | 9/2013 | Bogenberger et al. | |
| 9,052,887 B2 | 6/2015 | Rohleder et al. | |
| 2006/0161918 A1* | 7/2006 | Giers | G06F 12/1491 |
| | | | 718/102 |
| 2009/0204740 A1* | 8/2009 | Weiberle | G06F 11/1695 |
| | | | 710/269 |
| 2010/0281239 A1* | 11/2010 | Sudhakar | G06F 9/3891 |
| | | | 712/222 |
| 2012/0304024 A1* | 11/2012 | Rohleder | G06F 9/38 |
| | | | 714/49 |
| 2014/0082413 A1 | 3/2014 | Bilich | |
| 2014/0359225 A1 | 12/2014 | Lee | |
| 2015/0212952 A1 | 7/2015 | Wegner et al. | |
| 2016/0283314 A1* | 9/2016 | Thanner | G06F 11/1629 |

FOREIGN PATENT DOCUMENTS

| | | | | |
|---|---|---|---|---|
| CN | 104820626 A | | 8/2015 | |
| DE | 102012212304 A1 | * | 1/2014 | .......... G06F 11/1641 |
| EP | 0969374 A2 | | 1/2000 | |
| EP | 2153328 A1 | | 2/2010 | |
| WO | 2008146091 A1 | | 12/2008 | |
| WO | 2014009243 A2 | | 1/2014 | |

* cited by examiner

METHOD AND APPARATUS FOR REDUNDANT DATA PROCESSING IN WHICH THERE IS NO CHECKING FOR DETERMINING WHETHER RESPECTIVE TRANSFORMATIONS ARE LINKED TO A CORRECT PROCESSOR CORE

BACKGROUND OF THE INVENTION

Field of the Invention

The invention relates to a method and an integrated circuit for redundant data processing.

Safety-relevant software applications, for example software for controlling an interlocking system or the like, generally have to meet special safety requirements, which are specified in the safety standards EN 61508 or EN 50129.

Safety-critical software is usually characterized by the fact that at least portions of a software application are executed redundantly. The results emerging from redundant execution of this kind are then compared. If discrepancies between individual results are detected, an error is present, for example a hardware error, which can be identified in this way.

It is possible to use processors that are independent of one another for redundant concurrent execution of software applications. Here, expense is incurred due to the high use of materials. In addition, methods for the synchronization of the individual processors may be necessary. In this instance, the applicant's SIMIS technology can be cited by way of example.

In the case of special processors used for safety functions, such as, for example, so-called lockstep processors, two processor cores work synchronously on a processor such that the results of processor core computing operations can be continuously compared and monitored by a comparison module on the processor. If there is a discrepancy, the system stops. In this context, it is necessary for the software on the two processor cores to run virtually identically.

Furthermore, it is possible for software and data items to be coded differently several times so that similar hardware errors do not have the same effect on the software. One example of this the applicant's failsafe Simatic solution. Here, expense is incurred due to the fact that identical sequences have to be coded in different ways.

Finally, it is possible merely to emulate parallel redundant execution of a software application. This is achieved, for example, by using a software-based emulator that can be executed on one processor and is configured to emulate execution of the software application on different processors. This has the advantage that it is possible to save on hardware. The disadvantage of this solution is the higher runtime due to the emulation.

It is, in principle, possible for the redundant, preferably concurrent, execution of a software application to use different processor cores of one multi-core processor instead of different processors. However, in this case, it should be noted that the processor cores of a multi-core processor share at least some of the processor's hardware resources, such as, for example, data lines or control lines in the processor, cache lines, cache memories, etc. Therefore, the processor cores are not completely independent of one another. As a result, it is possible that a useful program executed redundantly on the different processor cores may react similarly or even identically to errors originating from the resources shared by the different processor cores. These are referred to as "common cause" errors. Therefore, a comparison of redundantly executed software on different processor cores of a multi-core processor is not always sufficient in the event of errors in shared hardware resources to identify errors in these hardware resources.

SUMMARY OF THE INVENTION

The object of the present invention is to address the aforementioned disadvantages and suggest an apparatus and a method that enable the use of different processor cores of one multi-core processor for redundant execution of a safety-critical application.

The invention provides an arrangement for redundant data processing with an integrated circuit. The functionality of a multi-core processor with a plurality of processor cores is implemented in the integrated circuit. The processor cores are each embodied to execute a useful program. The arrangement furthermore comprises a comparison module, which is configured to compare results emerging from execution of the useful program by different representatives of the processor cores in each case. A first processor core and a second processor core different from the first processor core out of the plurality of processor cores are implemented in the integrated circuit such that the first processor core uses an address structure to store and read data items in or from a first memory area assigned to the first processor core that differs from an address structure used by the second processor core to store and read data items in or from a second memory area assigned to the second processor core. Alternatively or additionally, the first processor core and the second processor core are implemented in the integrated circuit such that the first processor core uses a data structure to store and read data items in or from a first memory area assigned to the first processor core that differs from a data structure used by the second processor core to store and read data items in or from a second memory area assigned to the second processor core. The implementation of the first processor core in the integrated circuit is at least partially separated from the implementation of the second processor core in terms of hardware.

The method according to the invention for redundant data processing by means of an arrangement with an integrated circuit comprises the following steps:

A useful program is executed by a first processor core and a second processor core of a multi-core processor implemented by the integrated circuit. Then results emerging from execution of the useful program by the first processor core and from execution of the useful program by the second processor core are compared. Herein, the first processor core uses an address structure to store and read data items in or from a first memory area assigned to the first processor core, which differs from an address structure used by the second processor core to store and read data items in or from a second memory area assigned to the second processor core. Alternatively or additionally, the first processor core uses a data structure to store and read data items in or from a first memory area assigned to the first processor core that differs from a data structure used by the second processor core to store and read data items in or from a second memory area assigned to the second processor core. The first processor core is implemented in the integrated circuit at least partially separately from the second processor core in terms of hardware. For example, address lines to a shared memory from the first processor core can be laid in a different sequence than those from the second processor core. This automatically results in address scrambling. Patterns in the memory that occur repetitively due to errors then have different effects on the two cores. In a similar way, it is possible to access data items in that data lines are laid in a different sequence to the two processor cores. Obviously, a hardware-based implementation of the two processor cores enables data and/or address scrambling to be as complicated as desired.

Obviously, the invention is not restricted to a first and a second processor core of a multi-core processor. In the case of a multi-core processor with more than two processor cores, these processor cores can behave in pairs with respect to one another in the same way as described above with reference to the first processor core and the second processor core.

The invention provides a number of advantages, which are explained below, also with reference to preferred embodiments of the invention.

The fact that the individual processor cores use specific address structures and/or data structures assigned to the respective processor cores in each case to store or read data items in or from memory areas enables errors in the resources that are shared by different processor cores, in particular in a shared memory but also in shared data or address lines, to be identified. This is because errors based on a malfunction of one of these resources manifest themselves differently in each of the processor cores as a result of the use of the processor-core-specific address structure or data structure.

According to one embodiment, the first processor core and the second processor core are implemented such that the second processor core uses an address structure to store and read data items in or from the second memory area that is transformed compared to an address structure used by the first processor core to store and read data items in or from the first memory area. The type of transformation can vary. The transformation can preferably be defined by scrambling, i.e. a generally (pseudo) random permutation of memory addresses of a memory area assigned to the respective processor core.

According to a further embodiment, the first processor core and the second processor core are implemented such that the second processor core uses a data structure to store and read data items in or from the second memory area that transforms data words compared to a data structure used by the first processor core to store and read data items in or from the first memory area. Herein, data words can in particular be transformed by means of bit shifting. Other arithmetic operations can also be used to transform a data word to be stored/read, for example multiplying with a prime number.

In particular to enable data communication between a software application executed on the respective processor cores with an instance outside the respective processor core, according to one embodiment, an input and output storage area can be provided. Data items that are stored in this memory should have an address and data structure that is used by one of the processor cores to store or read data items in or from this input and output storage area that follows a predetermined address and data structure that is also known to the external instance. In other words, here the processor cores do not use processor-specific transformed address structures or data structures.

Compared to the use of a plurality of independent processors for redundant execution of the useful program, the present invention has the advantage that the processor cores of the multi-core processor can share hardware resources of the integrated circuit, such as, for example, memory, data and address lines, etc. This leads to an improved efficiency of the overall calculation. In other words, according to one preferred embodiment, the functionality of the multi-core processor in the integrated circuit is implemented such that the first processor core and the second processor core are configured to share hardware resources of the integrated circuit.

The present invention provides a number of further advantages compared to an in principle possible purely software-based solution with which the functionality of a multi-core processor is implemented in that an emulator emulates the processor cores of the multi-core processor. The fact that at least part of the functionality of the multi-core processor is implemented directly in hardware or at least configured in hardware enables the redundant calculation of the useful program to run much faster than in a purely software-based emulator. Therefore, runtime gains are achieved solely as a result of the fact that the implementation of the first processor core in the integrated circuit is at least partially separated from the implementation of the second processor core in terms of hardware, i.e. the functionality of the processor cores is at least partially configured directly in the hardware.

The last feature mentioned, according to which the implementation of the first processor core in the integrated circuit is at least partially separated from the implementation of the second processor core in terms of hardware, provides further advantages. This feature enables it to be ensured that requirements that have to be enforced and monitored with a software-based emulator solution, in particular the linkage of a predetermined functionality to a specific processor core, are made more or less immediately according to the invention.

Specifically, according to one embodiment, the functionality of transforming the address structure and/or the data structure for the first processor core and the second processor core in the integrated circuit in terms of hardware can be implemented separately for example. This embodiment makes it possible to dispense with a check as to whether these functionalities are in each case linked to the correct processor core, which would be necessary according to the emulator solution.

A similar increase in efficiency is obtained in conjunction with a further preferred embodiment of the invention according to which the first processor core and the second processor core are in each case implemented such that they are configured to acquire data items during the runtime that describe a program sequence during execution of the useful program. Such data items are in particular visited memory addresses and values stored therein. If appropriate, it is then possible to form a hash value or the like from these data items. Data items acquired in this way, which are also referred to as a "dataflow digest", can be compared by the comparison module as results or partial results of execution of the useful program at predetermined times during or after execution of the useful program by the first and the second processor core. If the acquired data items or the hash values formed therefrom are not identical for individual examples of the parallel program executions, this is indicative of an error in at least one of the program sequences. In particular hardware errors can be reliably identified in this way.

While it is necessary to ensure in conjunction with a pure emulator solution that the acquisition of these data items and, if appropriate, the calculation of the hash value is in each case uniquely assigned to one processor core, this can be omitted in the present case. This is because it is provided according to one embodiment that the functionality for acquiring the data items describing the program sequence is in each case implemented separately for the first processor core and the second processor core in the integrated circuit.

Furthermore, it is also possible to omit an analysis of the computer architecture used such as that required in conjunction with a pure emulator solution in order to assess the impacts of this architecture on specific security mechanisms. According to the invention, the configuration of the hardware used is adapted as required.

To summarize, the feature according to which the implementation of the first processor core in the integrated circuit is at least partially separated from the implementation of the second processor core in terms of hardware, i.e. according to which individual functionalities of the individual processor cores are in each case configured separately in the hardware used, provides substantially functionally clearly separate processor cores, functionally clearly separate memory and data access mechanisms and functionally clearly separate monitoring mechanisms in respect of a program sequence. Finally, the significant gains in performance should be mentioned.

According to a first preferred embodiment, the functionality of the multi-core processor can be configured as a softcore in a field-programmable gate array (FPGA). Herein, the individual processor cores are preferably configured as separate units in the FPGA. This can be achieved in that the individual processor cores and their specific functionalities, in particular with reference to the address structures and data structures used to store and read data items in or from the memory areas assigned in each case to the respective processor core and with reference to the acquisition of an above-described dataflow digest, are in each case provided with separate descriptions in a suitable hardware description language, such as, for example, VHDL, on the basis of which the respective processor cores are then configured or synthesized in the FPGA.

According to an alternative embodiment, the multi-core processor can be implemented as a "hardcoded" CPU in an application-specific integrated circuit (ASIC). According to this embodiment, the individual processor cores are then provided in "hardcoded" form as separate units.

To ensure portability of the arrangement according to the invention, for example in the event of obsolescence, it is possible for a computer-readable storage medium to be provided that comprises a definition of an implementation of a multi-core processor of the above-described arrangement according to the invention. Herein, the definition is provided by means of a hardware description language, in particular by means of the so-called Very High-Speed Integrated Circuit Hardware Description Language (VHDL). It is also possible to use alternative hardware description languages, such as, for example, Verilog. It is then very easily possible to configure new hardware at a very low level such that the functionality of the multi-core processor is restored.

BRIEF DESCRIPTION OF THE SEVERAL VIEWS OF THE DRAWING

The above-described properties, features and advantages of this invention and the manner in which these are achieved will become clearer and more plainly comprehensible in conjunction with the following description of the exemplary embodiments explained in more detail in conjunction with the drawings, in which.

DESCRIPTION OF THE INVENTION

Figure 1:
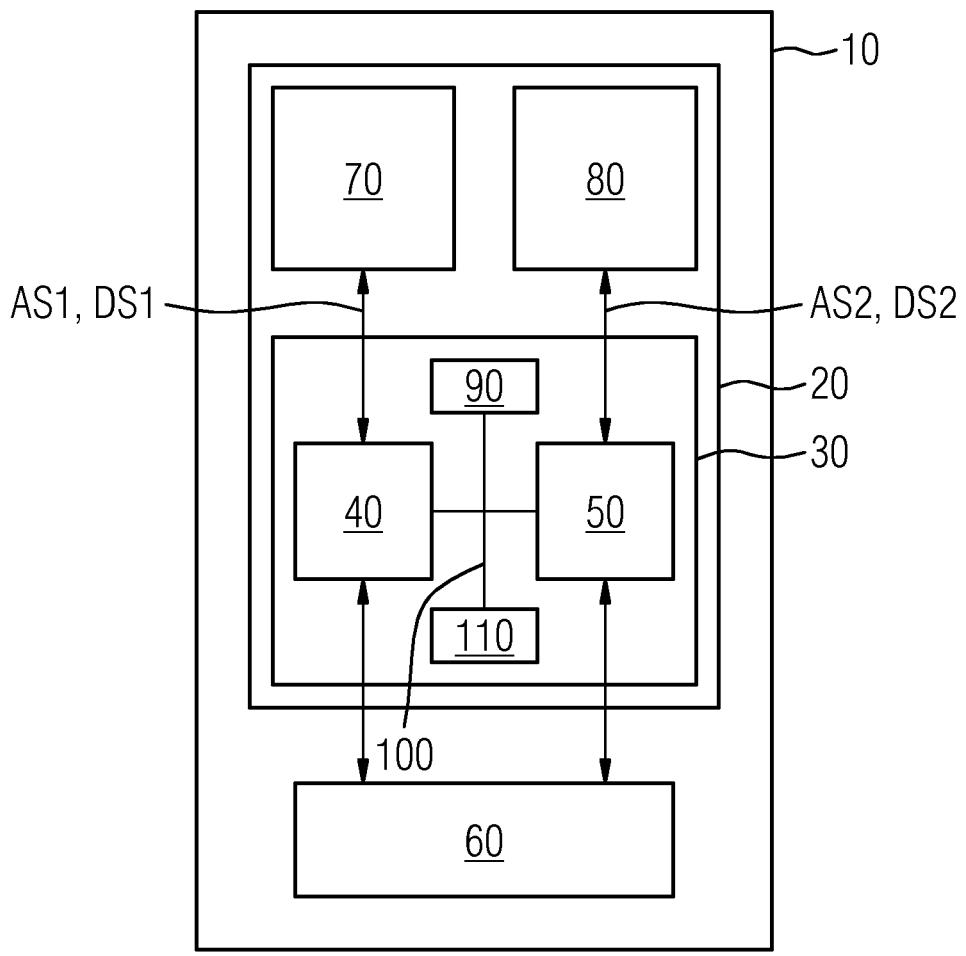
FIG. 1 shows a preferred embodiment of an arrangement according to the invention with an integrated circuit in which a multi-core processor is implemented.

FIG. 1 shows an arrangement 10 for redundant data processing with an integrated circuit 20. The arrangement 10 can be part of a controller for a technical system, for example an interlocking system for rail traffic.

The circuit 20 implements the functionality of a multi-core processor 30 comprising a first processor core 40 and a second processor core 50. The multi-core processor 30 comprises further resources that can be shared by the two processor cores 40, 50, such as, for example, a cache memory 110 and an input and output memory 90 and address and data lines 100.

The multi-core processor 30 is embodied according to a definition 130 specified in a hardware description language, such as, for example, VHDL, i.e. in this specific case configured in a FPGA of the integrated circuit 20. Herein, the two processor cores 40, 50 are configured in the FPGA such that essential functionalities of the processor cores 40, 50, which are described in more detail below, are in each case configured or synthesized separately and processor-core-specifically for each processor core 40, 50. Solely for the sake of clarity, the embodiment described here by way of example is limited to two processor cores only. In principle, the multi-core processor can comprise more than two processor cores, which can then behave in pairs with respect to one another as described below for the first and the second processor core 40, 50.

Figure 2:
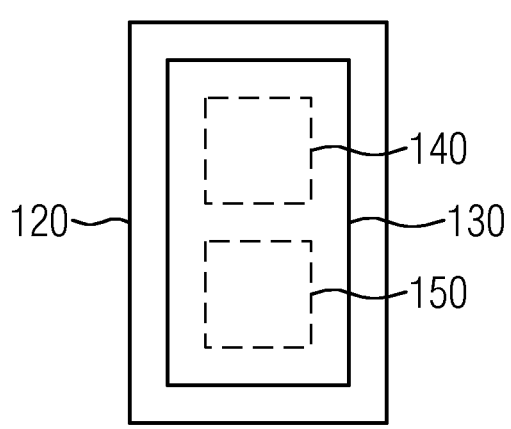
FIG. 2 shows a computer-readable storage medium on which a definition of the multi-core processor in FIG. 1 written in a hardware description language is stored.

FIG. 2 shows a schematic view of a computer-readable storage medium 120 on which a definition 130 of the multi-core processor 30 is stored. The definition is written in VHDL and comprises specific descriptive portions 140, 150 for each of the processor cores 40, 50.

Each of the processor cores 40, 50 is configured to execute a useful program (not shown), for example a control program for a technical system. Herein, parallel redundant execution of the useful program on the first processor core 40 and the second processor core 50 can increase the safety of the system. To this end, during and/or after execution of the useful program, a comparison module 60 compares interim results or final results which emerge in each case from execution of the useful program on the first processor core 40 and on the second processor core with one another. If a result emerging from execution of the useful program on the first processor core 40 is discrepant from a corresponding result emerging from execution of the useful program on the second processor core 50, this can be identified as an error in the execution of the program on one of the processor cores 40, 50. The cause of such an error can in particular be a hardware error.

Herein, according to the implementation or configuration of the first and second processor core 40, 50 explained below, it is also possible to identify hardware errors based on errors in hardware components, which are shared by the two processor cores 40, 50, such as, for example, the memory areas 90, 110 or the lines 100.

The first processor core 40 is configured in the FPGA such that it uses an address structure AS1 to store and read data items in or from a first memory area 70 assigned to the first processor core 40 that differs from an address structure AS2 used by the second processor core 50 to store and read data items in or from a second memory area 80 assigned to the second processor core 50. The first processor core 40 can, for example, use a processor-core-specific scrambled address structure AS1 that differs from another processor-core-specific scrambled address structure AS2 used by the second processor core 50.

The first processor core 40 is furthermore configured in the FPGA such that it uses a data structure DS1 to store and read data items in or from the first memory area 70 that differs from a data structure DS2 used by the second processor core 50 to store and read data items in or from the second memory area 80. The first processor core 40 can, for example, shift a data word to be stored by a predetermined number of bits compared to the second processor core 50.

The process-core-specifically scrambled address structure AS1, AS2 in each case and/or the process-core-specifically transformed data structure DS1, DS2 for storing data words enables hardware errors in resources 90, 100, 110 shared by the processor cores 40, 50 to be identified since these errors have different effects in the respective processor cores 40, 50, which are then manifested at the latest in different interim results or results during the parallel execution of the useful program. The functionality for scrambling the address structure and for transforming the data structure is configured separately for each processor core 40, 50 in the FPGA.

The first and the second processor core 40, 50 are furthermore configured to acquire data items describing the program sequence during execution of the useful program. These data items are in particular visited memory addresses and values stored therein. These data items can, for compression purposes, be used to form a hash value. The functionality for the acquisition of these control data items is configured separately for each processor core 40, 50 in the FPGA. Since both processor cores 40, 50 execute the same useful program, in a case in which, for example, a first interim result obtained from the first processor core 40 in the form of a hash value as explained above is discrepant from a hash value representing a corresponding second interim result relating to the second processor core 50, the comparison module 60 can assume the presence of an error during execution of the program in the first or second processor core 40, 50.

An input and output storage area 90 can be used for data input and data output via the multi-core processor 30. To this end, the first processor core 40 and the second processor core 50 are configured in the FPGA such that they access this input and output storage area 90 according to an externally predetermined address and data structure that is not transformed or scrambled. Herein, the data items stored in this memory area 90 can be additionally protected by means of a checksum. Herein, the checksum can be created in the respective processor core 40, 50.

Figure 3:
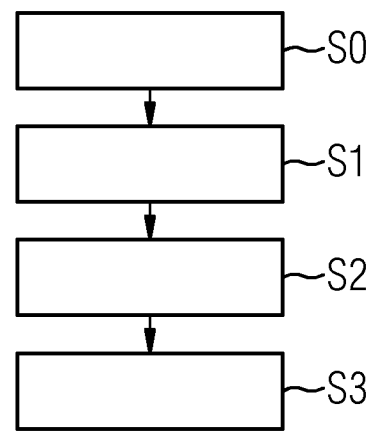
FIG. 3 shows steps of a preferred embodiment of a method according to the invention.

FIG. 3 is a schematic depiction of steps of a preferred embodiment of a method for redundant data processing.

In a preliminary step S0, a computer-readable storage medium 120 is provided on which the definition 130 of a multi-core processor 30 described above with reference to FIG. 1 is stored. The definition is worded in a suitable hardware description language, z. B. VHDL.

In step S1, the multi-core processor 30 is configured in a FPGA of an integrated circuit 20 according to the definition 130. As explained above with reference to FIG. 1, herein essential functionalities of the first and second processor core 40, 50 are in each case configured process-core-specifically and separately in the FPGA.

In step S2, a useful program is redundantly executed in parallel by the first processor core 40 and the second processor core 40.

Interim results or final results emerging from execution of the useful program by the first processor core 40 and from execution of the useful program by the second processor core 50 are compared in step S3 by the comparison module 60.

During execution of the useful program, the first processor core 40 uses an address structure AS1 to store and read data items in or from the first memory area 70 assigned to the first processor core 40 that differs from an address structure AS2 used by the second processor core 50 to store and read data items in or from the second memory area 80 assigned to the second processor core 50.

Furthermore, in this context, the first processor core 40 uses a data structure DS1 to store and read data items in or from the first memory area 70 that differs from a data structure DS2 used by the second processor core 50 to store and read data items in or from the second memory area 80.

To summarize, the present invention relates to an arrangement for redundant data processing, which comprises an integrated circuit which implements the functionality of a multi-core processor. Processor cores of the multi-core processor are each embodied to execute a useful program, wherein results emerging from execution of the useful program by different representatives of the processor cores can be compared by means of a comparison module of the arrangement. The processor cores differ from one another with respect to an address or data structure which is used by a processor core in each case to store and read data items in or from a memory area assigned to the respective processor core. The individual processor cores are at least partially implemented separately in the integrated circuit in terms of hardware.

Although the invention has been illustrated in detail by preferred exemplary embodiments, the invention is not restricted by the disclosed examples and other variations be derived herefrom by the person skilled in the art without departing from the scope of protection of the invention.

The invention claimed is:

1. An arrangement for redundant data processing, the arrangement comprising:
    an integrated circuit having a functionality of a multi-core processor with a plurality of processor cores, each of said processor cores being configured to execute a useful program;
    said plurality of processor cores including a first processor core and a second processor core different from said first processor core;
    wherein said first processor core is configured in at least one way selected from the group consisting of: using an address structure to store and read data items in or from a first memory area assigned to said first processor core that differs from an address structure used by said second processor core to store and read data items in or from a second memory area assigned to said second processor core, and using a data structure to store and read data items in or from the first memory area assigned to said first processor core that differs from the data structure used by said second processor core to store and read data items in or from the second memory area assigned to said second processor core;
    wherein an implementation of said first processor core is at least partially separate from an implementation of said second processor core in said integrated circuit in terms of hardware, and wherein the multi-core processor includes a cache memory, an input and output memory, and address and data lines shared by said first processor core and said second processor core; and wherein said second processor core is configured to use an address structure to store and read data items in or from the second memory area that is transformed in comparison with an address structure used by said first processor core to store and read data items in or from the first memory area;

the integrated circuit including hardware used for transforming the address structure or the data structure for the first processor core that is implemented separately from hardware of the integrated circuit used for transforming the address structure or the data structure for the second processor core.

2. The arrangement according to claim 1, wherein said first processor core and said second processor core are configured to share hardware resources of said integrated circuit.

3. The arrangement according to claim 2, wherein the address structure used by said second processor core is scrambled relative to the address structure used by said first processor core.

4. The arrangement according to claim 1, wherein said second processor core is configured to use a data structure to store and read data items in or from the second memory area, and wherein the data structure, which is used by said second processor core, transforms data words compared to a data structure used by said first processor core to store and read data items in or from the first memory area.

5. The arrangement according to claim 4, wherein the data structure used by the second processor core transforms data words by bit shifting or other arithmetic operations.

6. The arrangement according to claim 1, wherein each of said first processor core and said second processor core is configured to acquire data items during runtime that describe a program sequence during an execution of the useful program.

7. The arrangement according to claim 6, wherein a functionality for acquiring the data items describing the program sequence is implemented separately for said first processor core and said second processor core in said integrated circuit in terms of hardware.

8. The arrangement according to claim 1, comprising an input and output storage area for enabling data input into said multi-core processor and data output from said multi-core processor, and wherein said first processor core and said second processor core are configured to access said input and output storage area according to a predetermined address and data structure.

9. The arrangement according to claim 1, wherein the functionality of said multi-core processor is configured in a field-programmable gate array, and wherein said first and second processor cores are configured as separate units in said field-programmable gate array.

10. The arrangement according to claim 1, wherein said multi-core processor is implemented in an application-specific integrated circuit.

11. A non-transitory computer-readable storage medium comprising a non-transitory definition of an implementation of a multi-core processor of the arrangement according to claim 1 by a hardware description language.

12. The arrangement according to claim 1, wherein the transformation of the address structure that is used by said second processor core is scrambling.

13. A method for redundant data processing, the method comprising:

providing an arrangement with an integrated circuit having a multi-core processor with a first processor core and a second processor core, the first processor core being implemented at least partially separately from the second processor core in the integrated circuit in terms of hardware, wherein the multi-core processor includes a cache memory, an input and output memory, and address and data lines shared by the first processor core and the second processor core;

executing a useful program by the first processor core and the second processor core of the multi-core processor;

comparing results that emerge from executing the useful program by the first processor core with results that emerge from executing the useful program by the second processor core;

the first processor core performing at least one step selected from the group consisting of: using an address structure to store and read data items in or from a first memory area assigned to the first processor core that differs from an address structure used by the second processor core to store and read data items in or from a second memory area assigned to the second processor core, and using a data structure to store and read data items in or from the first memory area assigned to the first processor core that differs from a data structure used by the second processor core to store and read data items in or from the second memory area assigned to the second processor core;

with the second processor core, using an address structure to store and read data items in or from the second memory area that is transformed in comparison with an address structure used by the first processor core to store and read data items in or from the first memory area; and implementing hardware of the integrated circuit used for transforming the address structure or the data structure for the first processor core separately from hardware of the integrated circuit used for transforming the address structure or the data structure for the second processor core.

14. The non-transitory computer-readable storage medium according to claim 11, wherein the hardware description language is a Very High-Speed Integrated Circuit Hardware Description Language.

15. The method according to claim 13, wherein the transformation of the address structure that is used by the second processor core is scrambling.

* * * * *